United States Patent [19]
Chang et al.

[11] Patent Number: 6,037,238
[45] Date of Patent: Mar. 14, 2000

[54] PROCESS TO REDUCE DEFECT FORMATION OCCURRING DURING SHALLOW TRENCH ISOLATION FORMATION

[75] Inventors: Jung-Ho Chang, Uen-Lin; Hsi-Chuan Chen, Tainan; Dahcheng Lin, Hsinchu, all of Taiwan

[73] Assignee: Vanguard International Semiconductor Corporation, Hsin-Chu, Taiwan

[21] Appl. No.: 09/224,717

[22] Filed: Jan. 4, 1999

[51] Int. Cl.[7] .................................................... H01L 21/76
[52] U.S. Cl. ........................... 438/426; 438/436; 438/437
[58] Field of Search ................................... 438/424, 425, 438/426, 435, 436, 437

[56] References Cited

U.S. PATENT DOCUMENTS

| | | | |
|---|---|---|---|
| 4,571,819 | 2/1986 | Rogers et al. | 29/576 W |
| 4,952,524 | 8/1990 | Lee et al. | 437/67 |
| 5,420,454 | 5/1995 | Vook et al. | 257/518 |
| 5,447,884 | 9/1995 | Fahey et al. | |
| 5,492,858 | 2/1996 | Bose et al. | 437/67 |
| 5,604,149 | 2/1997 | Paoli et al. | 437/67 |
| 5,641,704 | 6/1997 | Paoli et al. | 438/436 |
| 5,643,823 | 7/1997 | Ho et al. | 437/67 |
| 5,705,417 | 1/1998 | Tseng . | |
| 5,780,346 | 7/1998 | Arghavani et al. | 438/296 |
| 5,792,684 | 8/1998 | Lee et al. | 438/238 |
| 5,801,083 | 9/1998 | Yu et al. | 438/424 |
| 5,882,983 | 3/1999 | Gardner et al. | 438/424 |

OTHER PUBLICATIONS

T. Sato, et al., "Trench Transformation Technology . . . Thin Dielectric Films", 1998 Symposium on VLSI Technology Digest of Technical Papers, pp. 206–207, 1998.

*Primary Examiner*—Wael Fahmy
*Assistant Examiner*—Long Pham
*Attorney, Agent, or Firm*—George O. Saile; Stephen B. Ackerman

[57] ABSTRACT

A process for creating an insulator filled, shallow trench isolation region, in a semiconductor substrate, has been developed. The process features the use of a high temperature hydrogen anneal, performed after an anisotropic RIE procedure, used to create the shallow trench shape, in the semiconductor substrate. The high temperature hydrogen anneal procedure repairs defects in the semiconductor substrate, created by the shallow trench, RIE procedure, and also creates a denuded zone, at or near the shallow trench shape, exposed silicon surface. The defect free denuded zone allows the formation of a uniform insulator trench liner to be realized, and also allows a minimum of junction leakage to occur at the region in which a source/drain-substrate junction, is butted against the side of the insulator filled, shallow trench.

17 Claims, 4 Drawing Sheets

PROCESS TO REDUCE DEFECT FORMATION OCCURRING DURING SHALLOW TRENCH ISOLATION FORMATION

BACKGROUND OF THE INVENTION (1) Field of the Invention

The present invention relates to processes used to fabricate semiconductor devices, and more specifically to a process used to create insulator filled, shallow trench, isolation regions.

(2) Description of the Prior Art

The use of localized oxidation of silicon, (LOCOS), as a method for creating isolation regions, for semiconductor devices, has been replaced by insulator filled, shallow trench regions. The increased cost and performance objectives, of the semiconductor industry, are difficult to achieve using a LOCOS, or a field oxide, (FOX), isolation technology. FOX procedures, accomplished via thermal oxidation of exposed regions of the semiconductor substrate, to be used as isolation regions, normally result in "birds beak" phenomena, or unwanted growth of silicon dioxide, under the edges of a oxidation resistant mask, used to protect the device region from the FOX procedure. Therefore to maintain the desired dimensions for the active device region, an increase in the design dimensions of the active device region has to be included to accommodate the unwanted "birds beak" formation. The use of larger than desired design dimensions, result in larger than desired semiconductor chips, resulting in less chips being obtained from a specific size, semiconductor substrate, thus increasing the processing costs for a specific semiconductor chip.

The use of shallow trench isolation, (STI), wherein a shallow trench is formed in a semiconductor substrate, followed by filling the shallow trench with a chemically vapor deposited, (CVD), insulator layer, allows the designed, active device region to remain intact, without the "birds beak" encroachment presented with LOCOS type isolation formation. The use of STI procedures, however do inherent problems, in the form of device leakage, and yield phenomena. For example the trench profile, needed to maintain design groundrules, and needed to allow adequate insulator fill, has to be created using either isotropic or anisotropic, reactive ion etching, (RIE), procedures. These RIE procedure can result in bombardment damage to silicon regions, exposed in the shallow trench. These defects, near the surface of the shallow trench, do not allow a uniform, silicon oxide liner layer, to be thermally grown. The silicon oxide liner, used to separate silicon regions from the CVD insulator fill, in addition to not being uniform in thickness, as a result of the RIE damage, can also be defective, in terms of low breakdown strength, as a result of being grown from a silicon surface that was exposed to the RIE, or plasma bombardment. In addition the defects in these silicon regions, when interfaced with active device regions, such as source/drain regions, of a metal oxide semiconductor field effect transistor, (MOSFET), device, can result in unwanted junction leakage, and possible yield loss.

This invention will describe a process for creating a shallow trench, in a semiconductor region, however subjecting the etched trench to a specific, high temperature hydrogen anneal, prior to the formation of the trench liner layer. This high temperature hydrogen anneal allows repair of the silicon surface, previously damaged by RIE bombardment. The silicon surface is also more accessible when using hydrogen anneals, than when using nitrogen, or other inert annealing ambients, due to the ability of hydrogen to reduce native oxide, on the silicon surface, and thus directly treat the damaged silicon surface. In addition the use of the high temperature hydrogen anneal, results in the formation of a denuded zone, a region of decreased oxygen in silicon, near the STI surface, allowing subsequent junction formation near the STI region, to be realized with reduced junction leakage. Prior art, such as Fahey et al, in U.S. Pat. No. 5,447,884, describe a process for STI formation, however without the critical high temperature anneal procedure, taught in this present invention, and needed for optimum junction quality.

SUMMARY OF THE INVENTION

It is an object of this invention to create insulator filled shallow trench regions, to be used for isolation regions in semiconductor devices.

It is another object of this invention to perform a high temperature, hydrogen anneal, after the anisotropic RIE procedure, used to create the shallow trench in the semiconductor substrate.

It is yet another object of this invention to form a defect free denuded zone, in the semiconductor substrate, at, or just below, the exposed surfaces of the shallow trench, via a high temperature hydrogen anneal, performed prior to the creation of a shallow trench, insulator liner layer.

In accordance with the present invention a process for creating an insulator filled shallow trench has been developed, featuring a high temperature, hydrogen anneal procedure, performed prior to growing a shallow trench, insulator liner layer, and used to remove defects in silicon, occurring as a result of the shallow trench, anisotropic RIE procedure, and also used to create a defect free denuded zone, in regions of the semiconductor substrate, exposed in the shallow trench. Photolithographic and anisotropic RIE procedures are used to create a shallow trench pattern in a silicon nitride-silicon oxide layer, and followed by the creation the shallow trench shape in the semiconductor substrate. After removal of the photoresist shape, used for shallow trench definition, a high temperature hydrogen anneal cycle is used to remove defects in regions of the semiconductor substrate, that were exposed to the shallow trench etching procedures, in addition to creating a defect free denuded zone, in a region of the semiconductor, at, or just below the surface of the shallow trench. A silicon oxide, liner layer, is then thermally grown on the exposed surfaces of the shallow trench, followed by a deposition of an insulator layer, filling the shallow trench. A chemical mechanical polishing, (CMP), procedure, is then used to remove insulator layer from the top surface of the silicon nitride-silicon oxide layer, resulting in an insulator filled, shallow trench. After removal of the silicon nitride-silicon oxide layer, a MOSFET device is formed on the semiconductor substrate, comprised of a polysilicon gate structure, on an underlying gate insulator layer, and a source/drain region located between the polysilicon gate structure, and the insulator filled, shallow trench, butting the insulator filled, shallow trench, in the defect free denuded zone.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming an insulator filled, shallow trench, in a semiconductor substrate, using a high temperature hydrogen anneal cycle, performed after the creation of the shallow trench shape, and prior to growing a shallow trench insulator liner, will now be described in detail. This invention will show the creation of an insulator filled shallow trench, used as an isolation region for an N channel, (NFET), MOSFET device, however the shallow trench process, described in this invention, can be used as an isolation region for P channel, (PFET), devices, as well as for complimentary, (CMOS), devices.

Figure 1:
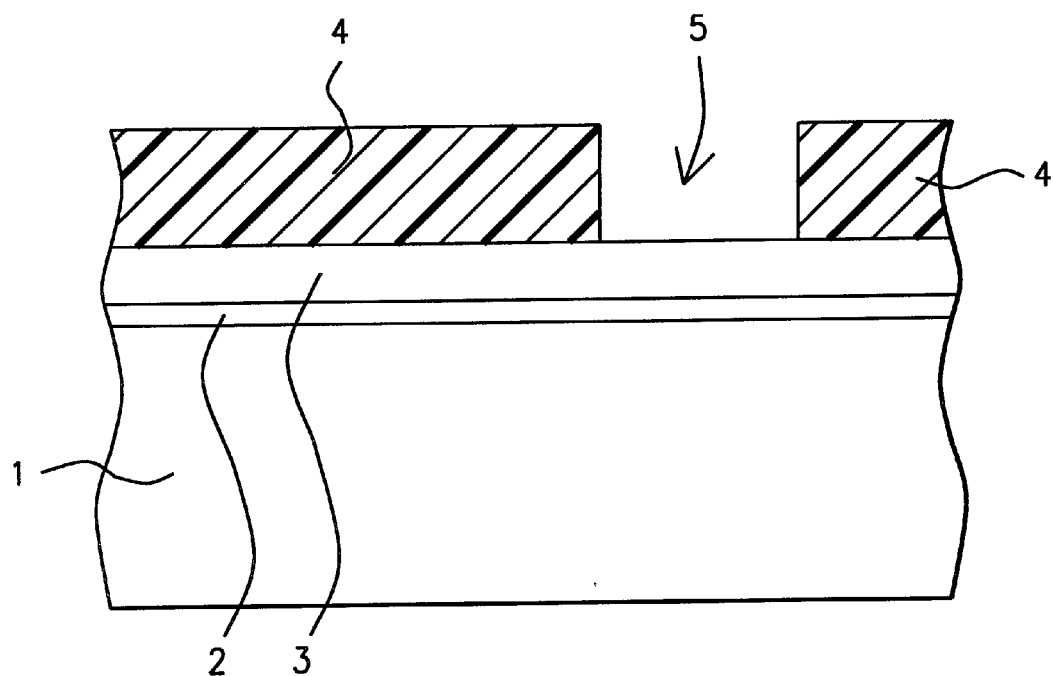
FIGS. 1–9, which schematically, in cross-sectional style, describe key stages of fabrication, used to create an insulator filled, shallow trench, in a semiconductor substrate, featuring a high temperature, hydrogen anneal cycle, used to remove defects, and to create an defect free denuded zone, at, or just below, the surfaces of the shallow trench.

A P type, semiconductor substrate 1, schematically shown in FIG. 1, is used, comprised of single crystalline silicon, exhibiting a <100> crystallographic orientation. A silicon oxide layer 2, used as a pad oxide layer, is thermally grown, in an oxygen-steam ambient, to a thickness between about 50 to 100 Angstroms. A silicon nitride layer 3, is next deposited, via low pressure chemical vapor deposition, (LPCVD), or plasma enhanced chemical vapor deposition, (PECVD), procedures, to a thickness between about 800 to 3000 Angstroms. A photoresist shape 4, with an opening 5, shown schematically in FIG. 1, is formed on the surface of silicon nitride layer 3.

Figure 2:
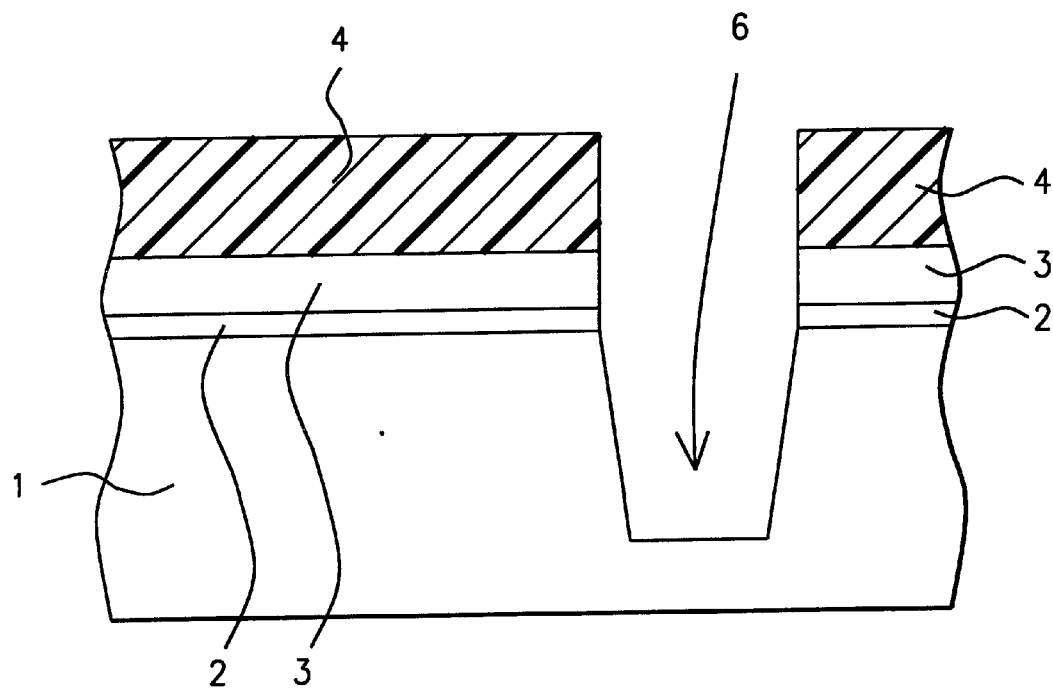

An anisotropic RIE procedure, using $CF_4$ as an etchant for silicon nitride layer 3, and using $CHF_3$ as an etchant for silicon oxide layer 2, is used to transfer opening 5, in photoresist shape 4, to the silicon nitride-silicon oxide layer. Next an anisotropic RIE procedure, using $Cl_2$ as an etchant, at a pressure between about 50 to 300 mTorr, and at an R.F. power between about 200 to 600 watts, is used to create shallow trench 6, using opening 5, in photoresist shape 4, as a mask. Shallow trench 6, created using the above conditions, and shown schematically in FIG. 2, is at a depth in semiconductor substrate 1, of between about 2000 to 5000 Angstroms, with a tapered angle of the trench wall, to the vertical line, between about 0 to 45°. The anisotropic RIE conditions, used to create shallow trench 6, can result in damage to silicon surfaces, exposed in the shallow trench. These defects, at the surface of the shallow trench, can adversely influence the growth of a shallow trench insulator liner layer, as well as initiating junction leakage, in areas in which source/drain to substrate junctions are formed, butting the shallow trench. Therefore a procedure used to remove the defects in silicon, created from bombardment during the anisotropic RIE procedure, used to create shallow trench 6, is next addressed.

Figure 3:
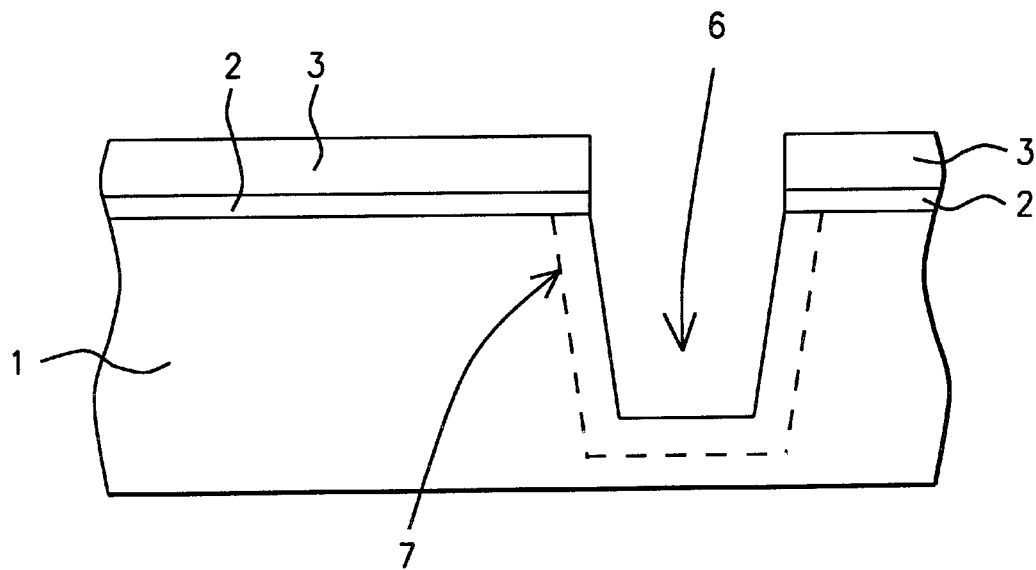

After removal of photoresist shape 4, via plasma oxygen ashing and careful wet cleans, a high temperature hydrogen anneal procedure is employed. The hydrogen anneal is performed, at a temperature between about 800 to 1100° C., for a time between about 10 min. to 6 hrs, in either an LPCVD furnace, an atmospheric pressure furnace, or in a single wafer tool, using a hydrogen concentration between about 3 to 100%. The hydrogen anneal allows light point defects, dislocations, or oxygen precipitates, in silicon, at, or near the surface, to be repaired. The ability of hydrogen to reduce native oxide, on the exposed surfaces of shallow trench 6, allows hydrogen access to the damaged silicon. Other non-reducing ambients, such as nitrogen or argon, would not be able to supply the dislocated silicon atoms the energy needed to form a single crystalline structure, even at high temperatures. In addition the high temperature hydrogen anneal, reduces the oxygen content in semiconductor substrate 1, in a region at, or just below the exposed surfaces of shallow trench 6, resulting in the creation of denuded zone 7, a zone, free of oxygen, schematically shown in FIG. 3. The defect free denuded zone, will subsequently be a location in which junctions, such as source/drain to substrate, will butt the shallow trench, thus the ability to remove defects from this region, and to create a denuded zone in this region, will result in reduced junction leakage.

Figure 4:
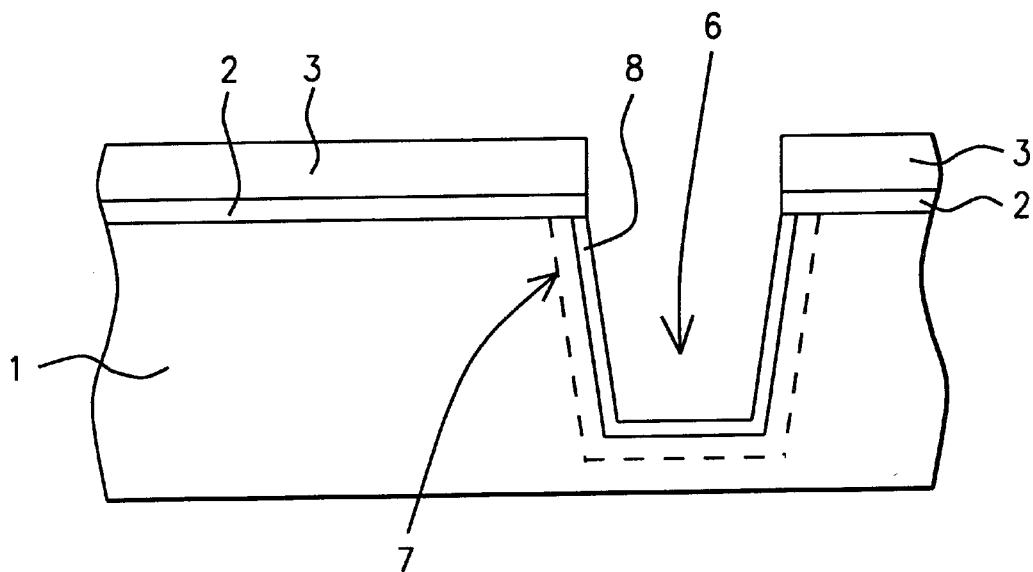

FIG. 4, schematically shows the formation of silicon oxide layer 8, used as an insulator liner for shallow trench 6. The use of an insulator liner is necessary to separate a subsequent insulator fill layer, from the semiconductor substrate. The insulator fill layer is obtained via CVD procedures, and thus may contain moisture and other impurities, thus maintaining a thermally grown insulator layer liner, as a barrier layer between the insulator fill and the semiconductor substrate, is needed. Silicon oxide layer 8, is thermally grown in an oxygen-steam ambient, at a temperature between about 800 to 1100° C., on denuded zone 7, at a thickness between about 50 to 500 Angstroms. If silicon oxide layer were thermally grown, on a non-hydrogen annealed, silicon surface, the uniformity, and dielectric breakdown strength, of the liner layer would be compromised.

Figure 5:
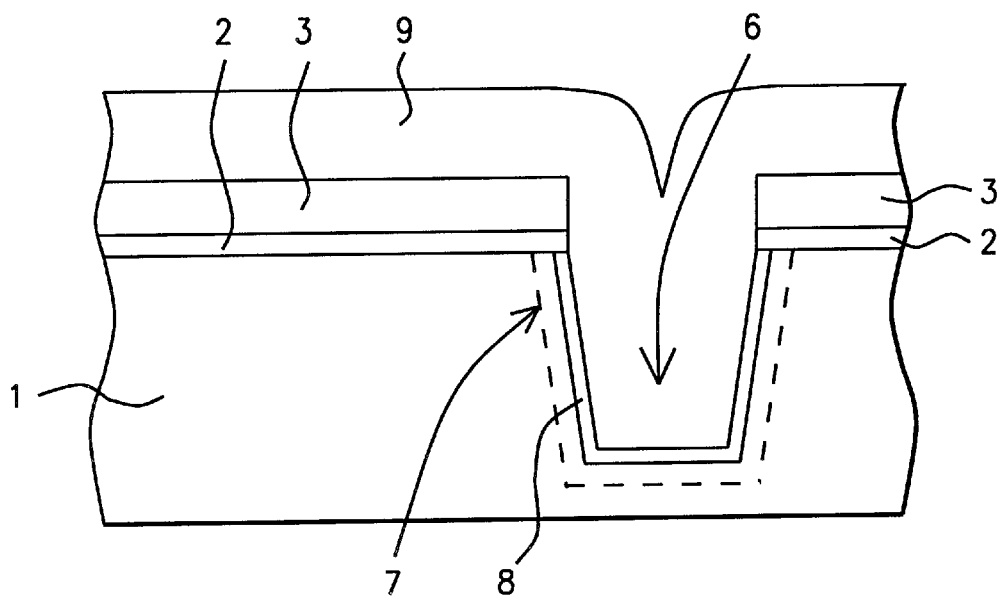
Figure 6:
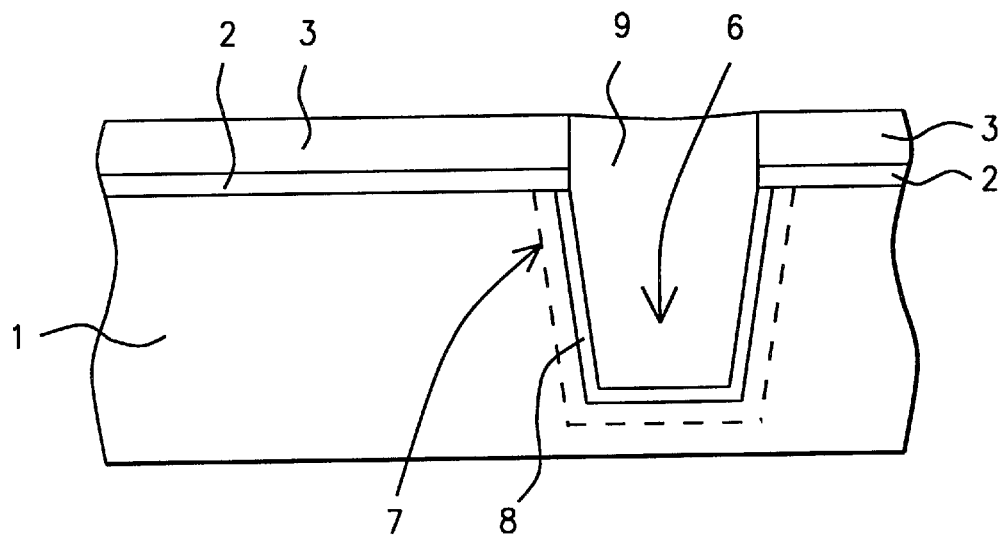
Figure 7:
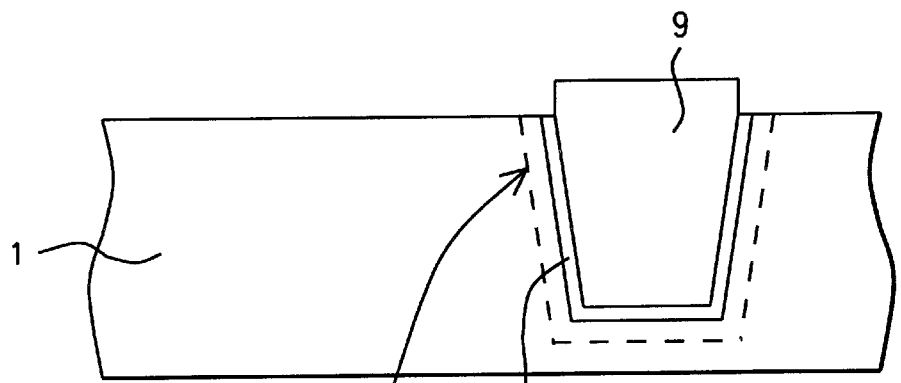

An insulator layer 9, such as a silicon oxide layer, is next deposited, via low pressure chemical vapor deposition, (LPCVD), or plasma enhanced chemical vapor deposition, (PECVD), procedures, to a thickness between about 2000 to 10000 Angstroms, completely filling shallow trench 6. This is schematically shown in FIG. 5. Removal of insulator layer 9, from the top surface of silicon nitride layer 3, is next addressed via a CMP procedure, or via a selective RIE procedure, using $CHF_3$ as an etchant for insulator layer 9. This is shown schematically in FIG. 6. The removal of silicon nitride layer 3, is performed via a selective RIE procedure, using $CF_4$ as an etchant, or via a hot phosphoric acid etch procedure, followed by the removal of silicon oxide layer 2, again via either a RIE procedure, using $CHF_3$ as an etchant, or via a buffered, or dilute hydrofluoric acid solution. FIG. 7, schematically shows the insulator filled shallow trench structure, after removal of these insulator layers, with insulator layer 9, in shallow trench 6, higher than the top surface of semiconductor substrate 1.

Figure 8:
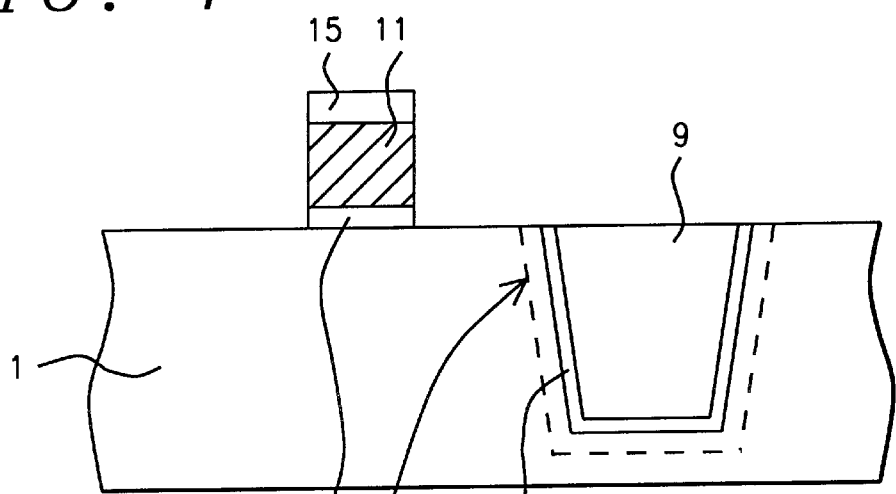
Figure 9:
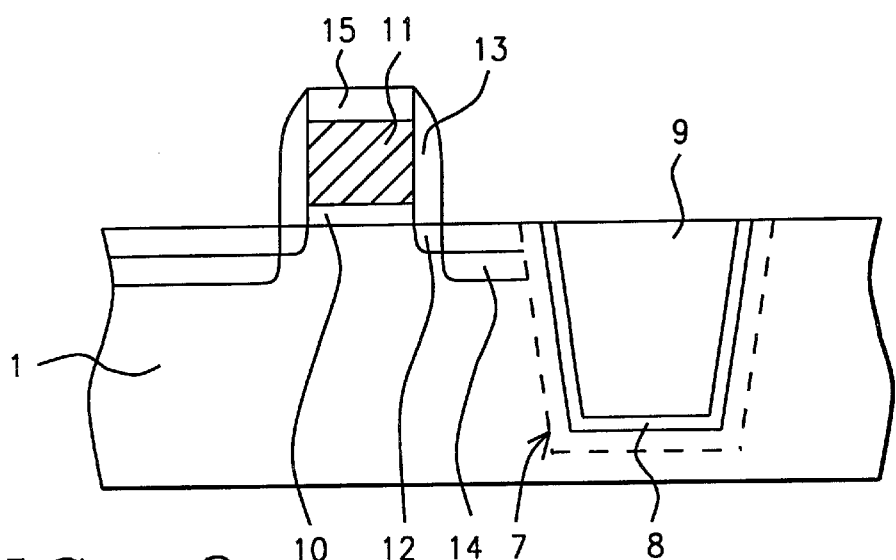

FIGS. 8–9 will schematically show the formation of a MOSFET device, with a source/drain region of the MOSFET device, butting the insulator filled shallow trench. After a series of wet clean procedures, a silicon dioxide, gate insulator layer 10, is thermally grown, in an oxygen-steam ambient, to a thickness between about 30 to 200 Angstroms. A polysilicon layer is next deposited, via LPCVD procedures, to a thickness between about 500 to 3000 Angstroms. The polysilicon layer is either in situ doped, during deposition, via the addition of phosphine, or arsine, to a silane ambient, or the polysilicon layer is deposited intrinsically and doped via ion implantation procedures, using arsenic or phosphorous ions. Another insulator layer 15, comprised of either silicon oxide, or silicon nitride, is deposited via LPCVD or PECVD procedures, to a thickness between about 500 to 2500 Angstroms. Conventional photolithographic and anisotropic RIE procedures, using $CHF_3$, or $CF_4$, as an etchant for insulator layer 15, while using $Cl_2$ as an etchant for the polysilicon layer, create polysilicon gate structure 11, shown schematically in FIG. 8. The photoresist shape, used to define polysilicon gate structure 11, is removed via plasma oxygen ashing and careful wet cleans. The wet clean procedure includes a buffered or dilute hydrofluoric acid step, which removes regions of silicon dioxide gate insulator layer, not covered by polysilicon gate structure 11.

Lightly doped source/drain region 12, is formed in regions of semiconductor substrate 1, not covered by polysilicon gate structure 11, or the insulator filled, shallow trench, via ion implantation of arsenic or phosphorous ions, at an energy between about 5 to 60 KeV, at a dose between about 1E13 to 1E15 atoms/cm$^2$. Next an insulator layer, such as silicon oxide, or silicon nitride, is deposited via LPCVD or PECVD procedures, to a thickness between about 100 to 1500 Angstroms, then subjected to an anisotropic RIE procedure, using $CHF_3$ as an etchant for silicon oxide, or using $CF_4$ as an etchant for silicon nitride, creating insulator spacers 13, on the sides of polysilicon gate structure 11. Finally heavily doped source/drain region 14, is formed in a region of semiconductor substrate 1, not covered by polysilicon gate structure 11, not covered by insulator spacers 13, and not covered by the insulator filled shallow trench, via ion implantation of arsenic or phosphorous ions, at an energy between about 30 to 100 KeV, at a dose between about 1E14 to 5E16 atoms/cm$^2$. The region in which the heavily doped source/drain-semiconductor substrate junction, butts the insulator filled shallow trench, shown schematically in FIG. 9, is in denuded zone 7, resulting in a minimum of junction leakage, when compared to counterparts in which this junction butted the insulator filled shallow trench, in a region of a substrate containing oxygen, or oxygen precipitates, formed during shallow trench etching.

While this invention has been particularly shown and described with reference to the preferred embodiments thereof, it will be understood by those skilled in the art that various changes in form and details may be made without departing from the spirit and scope of this invention.

What is claimed is:

1. A method of fabricating an insulator filled, shallow trench isolation region, in a semiconductor substrate, comprising the steps of:

depositing a first insulator layer, on said semiconductor substrate;

forming an opening in said first insulator layer, exposing a region of said semiconductor substrate;

forming a tapered shallow trench in said region of said semiconductor substrate, exposed in said in the opening in said first insulator layer;

performing a hydrogen anneal procedure, for a period between about 10 min to 6 hrs, in an atmospheric pressure furnace, creating a defect free denuded zone, in a region of said semiconductor, exposed in said tapered shallow trench;

growing a second insulator layer, lining a surface of said defect free denuded zone, in said semiconductor substrate;

depositing a third insulator layer, completely filling said tapered shallow trench; and removing said third insulator layer, from a top surface of said first insulator layer, creating said insulator filled, shallow trench isolation region.

2. The method of claim 1, wherein said first insulator layer, is a composite insulator layer, comprised of an overlying silicon nitride layer, obtained via LPCVD or PECVD procedures, at a thickness between about 800 to 3000 Angstroms, and an underlying silicon oxide layer, obtained via thermal oxidation procedures, or via LPCVD or PECVD procedures, at a thickness between about 50 to 500 Angstroms.

3. The method of claim 1, wherein said opening, in said first insulator layer, is created via an anisotropic RIE procedure, using $CF_4$ as an etchant for a silicon nitride component of said first insulator layer, and using $CHF_3$ as an etchant for a silicon oxide component of said first insulator layer.

4. The method of claim 1, wherein said tapered shallow trench, is formed in said semiconductor substrate, to a depth between about 2000 to 5000 Angstroms, via an anisotropic RIE procedure, using $Cl_2$ as an etchant, at a RIE pressure between about 50 to 200 mTorr, and at a R.F. power between about 200 to 600 watts, resulting in a tapered angle of the trench wall, between about 0 to 45°.

5. The method of claim 1, wherein said anneal procedure, performed in said atmospheric pressure furnace, for between 10 min to 6 hrs, used to create said defect free denuded zone, is performed using a hydrogen ambient, at a temperature between about 800 to 1100° C.

6. The method of claim 1, wherein said second insulator layer, formed on the surface of said defect free denuded zone, is a silicon oxide layer, obtained via thermal oxidation procedures, in an oxygen-steam ambient, at a temperature between about 800 to 1100° C., to a thickness between about 50 to 500 Angstroms.

7. The method of claim 1, wherein said third insulator layer, used to fill said tapered shallow trench, is a silicon oxide layer, obtained via LPCVD or PECVD procedures, at a thickness between about 2000 to 10000 Angstroms.

8. The method of claim 1, wherein said insulator filled, shallow trench isolation region, is formed via removal of said third insulator layer, from a top surface of said third insulator layer, via a CMP procedure, or via a selective RIE procedure, using $CHF_3$ as an etchant.

9. A method of fabricating a MOSFET device, on a semiconductor substrate, incorporating an insulator filled, shallow trench isolation region, in which a high temperature hydrogen anneal procedure, is performed after the creation of a tapered shallow trench shape, in an atmospheric pressure furnace, comprising the steps of:

forming a silicon oxide pad layer on said semiconductor substrate;

depositing a silicon nitride layer on said silicon oxide pad layer;

forming an opening in said silicon nitride layer, and in said silicon oxide pad layer, exposing a region of said semiconductor substrate;

forming said tapered shallow trench shape, in the region of said semiconductor substrate exposed in said opening;

performing said high temperature hydrogen anneal procedure, in said atmospheric pressure furnace, for a time between about 10 min to 6 hrs, creating a defect free oxygen denuded zone in a region of said semiconductor substrate, exposed in said tapered shallow trench shape;

growing a silicon oxide trench liner layer, on the surface of said defect free denuded zone;

depositing an insulator layer, completely filling said tapered hallow trench shape;

removing regions of said insulator layer, from a top surface of said silicon nitride layer, creating said insulator filled, shallow trench isolation region;

removing said silicon nitride layer;

removing said silicon oxide pad layer;

growing a silicon dioxide gate insulator layer, on the surface of said semiconductor substrate;

forming a polysilicon gate structure on said silicon dioxide gate insulator layer;

forming a lightly doped source/drain region, in a region of said semiconductor substrate not covered by said polysilicon gate structure;

forming insulator spacers on sides of said polysilicon gate structure; and forming a heavily doped source/drain region, in a region of said semiconductor substrate not covered by said polysilicon gate structure, and not covered by said insulator spacers, and with an edge of said heavily doped source/drain region, and an edge of a heavily doped source/drain region-semiconductor substrate junction, butted against a side of said insulator filled, shallow trench isolation region, located in said defect free denuded zone.

10. The method of claim 9, wherein said opening, in said silicon nitride layer, and in said silicon oxide pad layer, is formed via an anisotropic RIE procedure, using $CF_4$ as an etchant for said silicon nitride layer, and using $CHF_3$ as an etchant for said silicon oxide pad layer.

11. The method of claim 9, wherein said tapered shallow trench shape is formed, in said semiconductor substrate, via an anisotropic RIE procedure, using $Cl_2$ as an etchant, at an R.F. power between about 200 to 600 watts, and at a pressure between about 50 to 200 mTorr.

12. The method of claim 9, wherein said tapered shallow trench shape is formed to a depth, in said semiconductor substrate, between about 2000 to 5000 Angstroms.

13. The method of claim 9, wherein said high temperature hydrogen anneal, performed in said atmospheric furnace, for a time between about 10 min. to 6 hrs., is performed at a temperature between about 800 to 1100° C., using a hydrogen concentration between about 3 to 100%.

14. The method of claim 9, wherein said silicon oxide trench liner layer, is formed on said defect free denuded zone, via thermal oxidation procedures, at a temperature between about 800 to 1100° C., in an oxygen-steam ambient, to a thickness between about 50 to 500 Angstroms.

15. The method of claim 9, wherein said insulator layer, used to fill said shallow trench shape, is a silicon oxide layer, obtained via LPCVD or PECVD procedures, at a thickness between about 2000 to 10000 Angstroms.

16. The method of claim 9, wherein said insulator filled, shallow trench region, is formed via removal of said insulator layer, from the top surface of said silicon nitride layer, via a CMP procedure, or via a selective RIE procedure, using $CHF_3$ as an etchant.

17. The method of claim 9, wherein said heavily doped source/drain region, is formed via ion implantation of arsenic or phosphorous ions, at an energy between about 30 to 100 KeV, at a dose between about 1E14 to 5E16 atoms/$cm^2$.

* * * * *